(12) United States Patent
Nagaraj

(10) Patent No.: US 6,642,752 B1
(45) Date of Patent: Nov. 4, 2003

(54) BROADBAND SAMPLE AND HOLD CIRCUIT

(75) Inventor: Krishnasawamy Nagaraj, Hillsborough, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/251,425

(22) Filed: Sep. 20, 2002

(51) Int. Cl.⁷ .............................................. G11C 27/02
(52) U.S. Cl. .............................. 327/94; 327/95; 327/96
(58) Field of Search ....................... 327/91–96; 341/122

(56) References Cited

U.S. PATENT DOCUMENTS

| | | | | |
|---|---|---|---|---|
| 4,142,117 A | * | 2/1979 | Chang ........................... | 327/94 |
| 5,532,629 A | | 7/1996 | Nagaraj ......................... | 327/94 |
| 6,020,769 A | | 2/2000 | Vallancourt ................... | 327/94 |
| 6,052,000 A | | 4/2000 | Nagaraj ......................... | 327/94 |
| 6,232,907 B1 | | 5/2001 | Nagaraj et al. .............. | 341/159 |
| 6,265,911 B1 | | 7/2001 | Nairn ............................ | 327/94 |
| 6,323,697 B1 | | 11/2001 | Pavan ........................... | 327/94 |

* cited by examiner

*Primary Examiner*—Kenneth B. Wells
(74) *Attorney, Agent, or Firm*—W. Daniel Swayze, Jr.; W. James Brady; Frederick J. Telecky, Jr.

(57) ABSTRACT

A sample and hold device is provided in which sample switches are employed to switch between a sample phase and a hold phase. The sample and hold device provides alternate paths for the AC currents flowing to and from the sampling capacitor during the sample phase to mitigate the deleterious effects of the high AC currents through sample switches. The current drawn by the sampling capacitor from the input signal is replicated and directed to charge and discharge the sampling capacitor through alternate paths with respect to a path through the sample switches.

24 Claims, 9 Drawing Sheets

BROADBAND SAMPLE AND HOLD CIRCUIT

TECHNICAL FIELD

The present invention relates to circuits and more particularly to a broadband sample and hold circuit.

BACKGROUND OF INVENTION

Sample and hold circuits are used for sampling values of continuous time-varying amplitude signals at discrete time intervals. The sample and hold circuits can be employed as part of an analog-to-digital signal conversion process, such that the amplitude values of analog input signals are sampled at timed intervals and converted into digital values to provide a digital output representation of the time varying amplitude signal. FIG. 1 illustrates a conventional sample and hold circuit 10 employing a sampling capacitor C and an operational amplifier 12. The operational amplifier 12 is provided as an output buffer. A continuous time-varying amplitude input signals $V_{IN}$ (e.g., AC sine wave) is applied to the sampling capacitor C during a sample phase in which sample switches SA and SB are closed and a hold switch HA is open. The sampling capacitor C is connected to the input signal $V_{IN}$ through the sample switch SA and to ground through the sample switch SB. The sampling capacitor C charges to an amplitude level of the input signal $V_{IN}$ at the sampling interval, which is held by the capacitor C, and provided at an output of the operational amplifier 12 during a hold phase in which the sample switches SA and SB are opened and the hold switch HA is closed. The switches SA, SB and HA are controlled by a timing or clocking signal so that a plurality of samples can be taken of the input signal to determine various amplitude levels of the input signal, and a piecewise approximation of the input signal can be determined and converted to a digital representation of the analog input signal.

The sample and hold switches are typically implemented employing Metal-Oxide Semiconductor Field Effect Transistors (MOSFETs). In the conventional sample and hold circuits, the signals that control the switching of the sample and hold switches or MOS transistors are simple digital signals (e.g., 0, $V_{DD}$). The "ON" resistance of the MOSFET is the resistance between the source region and the drain region when the transistor is "ON" or conducting, which is a function of the gate to source voltage $V_{GS}$ and the source to back gate voltage $V_{SB}$. Therefore, the resistance of the input sampling switch varies with the input signal level. This causes the voltage across the capacitor C at the sampling instant to change with the amplitude of the input signal due to the non-linearity of the sampling switches. One solution to this problem is to employ a clock boosting circuit which ensures that the gate to source bias of the sampling switch is independent or a function of the signal amplitude, and that the gate to source voltage is held above the input signal or relatively constant reducing the non-linearity in the MOSFET switch.

Another problem is that as the input signal frequency increases, the AC currents flowing through the sampling switches increase. Therefore, the voltage drop across the switch resistances increase. MOSFET devices will enter non-linear resistor regions unless the voltage across the devices remains low. If the current through the switches remains within the linear region, the large voltages do not cause large voltage drops across the MOSFET switches. One solution would be to employ MOSFET devices with very large width to length ratios (W/L), thus, reducing their resistances. However, this increases the parasitic capacitances at the switch terminals. This in turn affects the speed of operation of the circuit. Also, the loading on the clock drivers increases, again effecting the speed of operation of the circuit.

In wireless receivers (e.g., broadband modem receivers) the voltage amplitudes and frequencies are relatively high causing the AC currents flowing through the sampling switches to be relatively high. In some applications employing wireless receivers, the input frequency can be much higher than the amplifier sampling frequency. These wireless receivers require sample and hold devices with input bandwidths that are much larger than the sampling frequency to facilitate direct demodulation of the radio frequency signals.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to sample and hold devices in which an input sample switch couples an input voltage signal to a first end of a sampling capacitor and a hold switch couples the sampling capacitor to an output terminal. The input sample switch can be, for example, a MOSFET switch. The MOSFET switch will enter non-linear resistor regions unless the voltage across the switch remains low. The present invention provides for an alternate path with respect to a path through the input sample switch through which a replicated current is generated and directed or steered into the first end of the capacitor during a sample phase to mitigate the deleterious effects of high currents through the input sample switch. If a ground sample switch is employed to couple a second end of the sampling capacitor to ground, a second current is replicated that discharges current through a second alternate path from the second end of the capacitor to mitigate the deleterious effects of high currents through the ground sample switch.

In one aspect of the invention, a first current mirror having a first capacitor draws current from the input voltage signal that is a replicate of a current required to charge the sampling capacitor to the sampled voltage. The first capacitor has a capacitive value substantially equivalent to the capacitive value of the sampling capacitor, so that the current drawn from the input signal by the first capacitor is substantially equivalent to the current required to charge the sampling capacitor. The replicated current is directed or steered into the first end of the sampling capacitor through a first alternate path with respect to a path through the input sample switch. The first current mirror provides a low impedance path for the replicated current to facilitate redirection of the input current from the input sample switch. The first current mirror can cooperate with a first current source to generate the replicated current.

If a ground sample switch is employed, a second current mirror having a second capacitor draws current from an inverted version of the input voltage signal that is a replicate of a current required to charge the sampling capacitor to the sampled voltage. The second capacitor has a capacitive value substantially equivalent to the capacitive value of the sampling capacitor, so that the current drawn from the input signal by the second capacitor is substantially equivalent to the current required to charge the sampling capacitor. The replicated current is directed or steered out of the second end of the sampling capacitor through a second alternate path with respect to a path through the ground sample switch. The second current mirror provides a low impedance path for the replicated current to facilitate redirection of the input current from the input sample switch. The second current mirror can cooperate with a second current source to generate the replicated current. The inverted version of the input signal can be provided employing an inverting amplifier, or from a negative rail of a differential input signal if the input voltage signal is differential.

These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates to sample and hold devices in which switches are employed to switch between a sample phase and a hold phase. During a sample phase, one or more sample switches are closed so that an input signal is applied to a sampling capacitor. The capacitor charges to a voltage amplitude level of the input signal level at the sampling interval. During a hold phase, the one or more sample switches are opened and one or more hold switches are closed, so that the voltage level of the charged capacitor is provided at an output terminal. The sampling capacitor requires currents to charge the capacitor to the amplitude of the input signal level, which can be substantially high at high input signal voltage levels and frequencies. The AC current flowing into the capacitor also flows out of the capacitor to ground. The high AC currents cause non-linearity in the sample switches during the sample phase. The present invention provides for replications of the current drawn by the sampling capacitor through samples switches and steers the replicated currents through alternate paths to mitigate the deleterious effects of the high AC currents through the sample switches.

Figure 1:
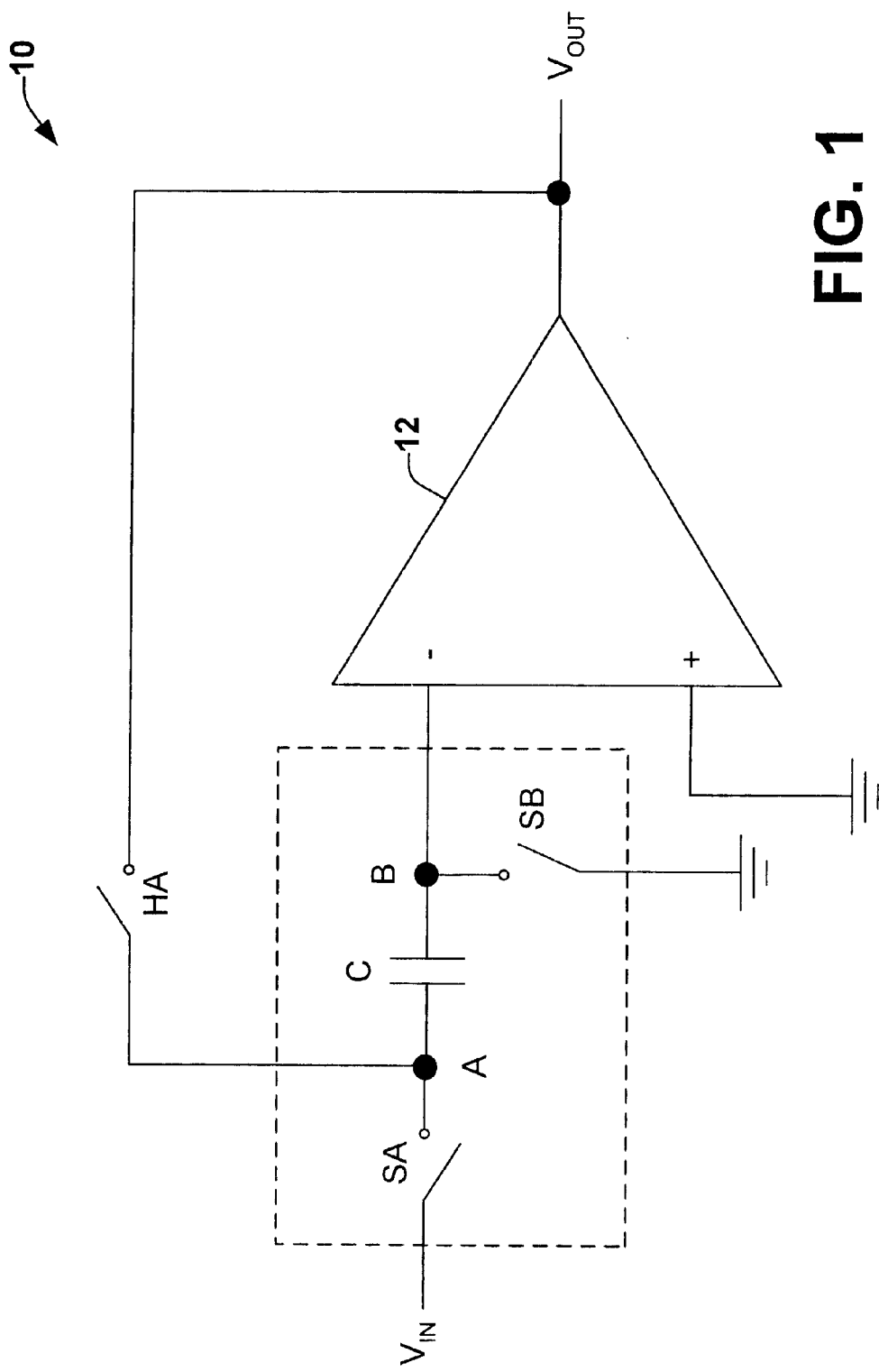
FIG. 1 illustrates a schematic diagram of a prior art sample and hold device.
Figure 2:
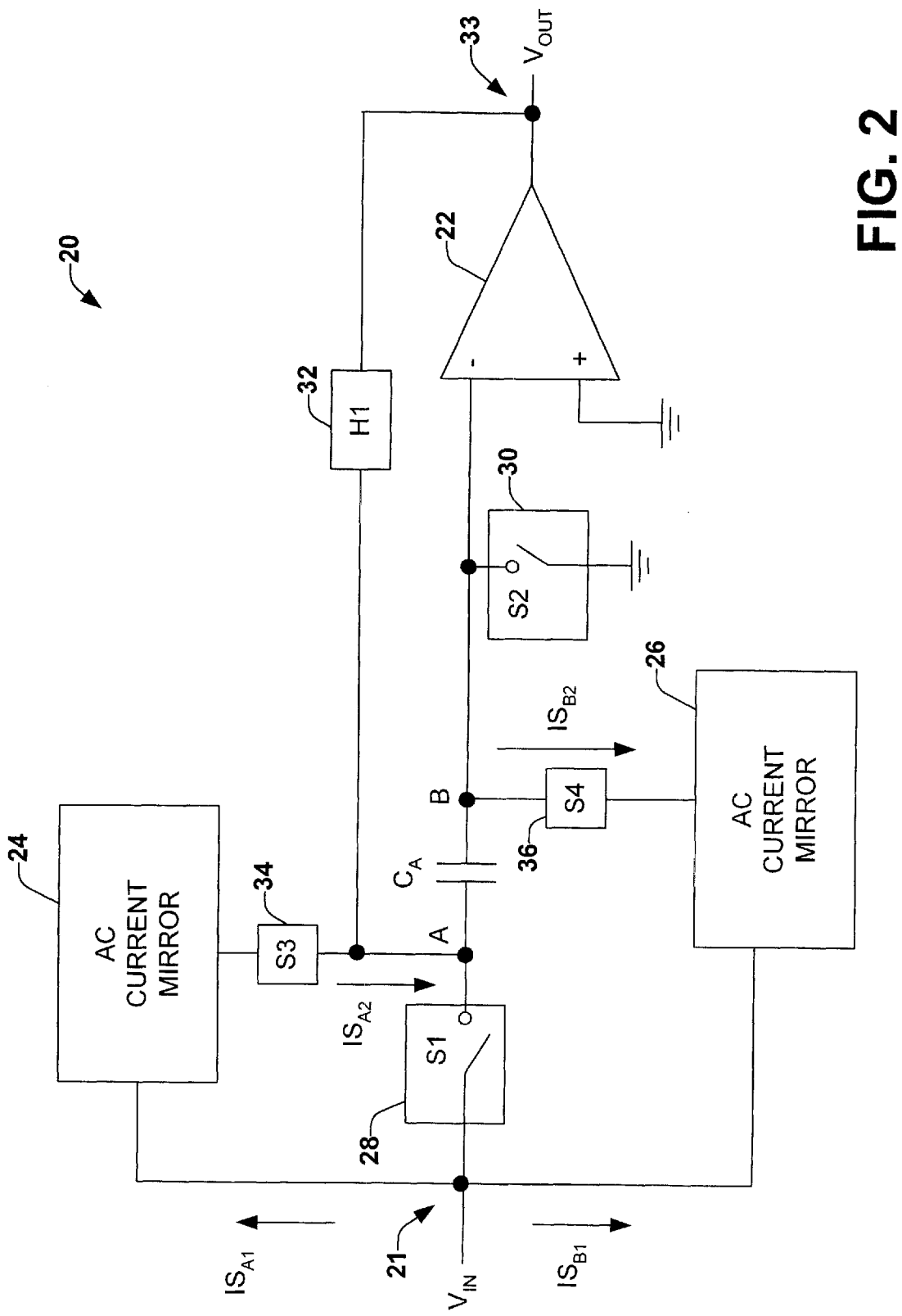
FIG. 2 illustrates a schematic block diagram of a sample and hold device in accordance with an aspect of the present invention.

FIG. 2 illustrates a sample and hold device 20 in accordance with an aspect of the present invention. The sample and hold device 20 includes a sampling capacitor $C_A$ coupled between a negative input terminal of an operational amplifier 22 through a node "B", and an input signal sample switch (S1) 28 through a node "A". A ground sample switch (S2) 30 is connected between the node "B" and ground. A hold switch (H1) 32 is coupled between the node "A" and an output terminal 33 of the operational amplifier 22. The input signal sample switch (S1) 28, the ground sample switch (S2) 30 and the hold switch (H1) 32, for example, are MOSFET devices.

The sample and hold device 20 includes a first AC current mirror 24 and a second AC current mirror 26 coupled to an input terminal 21. The first AC current mirror 24 is connected to node "A" through a switch (S3) 34, and the second AC current mirror 26 is connected to node "B" through a switch (S4) 36. The first and second AC current mirrors 24 and 26 mirror or replicate the current drawn by the sampling capacitor $C_A$, and steer the replicated current through alternate current paths, so that the current through the sample switches S1 and S2 is mitigated, while still providing the necessary current to charge the sampling capacitor $C_A$. The first AC current mirror 24 and the second AC current mirror 26 provide low impedance paths to draw the current required to charge the sampling capacitor $C_A$ along alternate paths. The alternate current paths minimize the current through the sample switches S1 and S2 which mitigates the effects of high current through the sample switches, and thus, the effects of non-linear resistances of the sample switches S1 and S2.

A continuous time-varying amplitude input signal $V_{IN}$ (e.g., AC sine wave) is applied at the input terminal 21. During a sample phase, sample switches S1 and S2 are closed and switches S3 and S4 are closed. The sampling capacitor $C_A$ is connected to the input signal $V_{IN}$ through the sample switch S1, and to ground through the sample switch S2. The AC current required to charge the sampling capacitor $C_A$ is drawn or replicated by the first AC current mirror 24 as $IS_{A1}$. and similarly by the second AC current mirror 26 as $IS_{A2}$. The first AC current mirror 24 provides or steers a reflected version $IS_{A2}$ of the current $IS_{A1}$ to the node "A" to provide the current necessary to charge the sampling capacitor $C_A$ through an alternate path than the path through the sample switch S1. The second AC current mirror 26 provides or steers a reflected version $IS_{B2}$ of the current $IS_{B1}$ from the node "B" to remove the discharge current from the sampling capacitor $C_A$ through an alternate path than through the sample switch S2

Therefore, the current through both sample switches S1 and S2 is mitigated such that the high currents required to charge the sampling capacitor $C_A$ at high frequencies do not flow through the sample switches S1 and S2, but flow through alternate paths. Therefore, the voltage drops across the switches S1 and S2 are mitigated. The sampling capacitor $C_A$ charges to an amplitude level of the input signal $V_{IN}$ at the sampling interval, which is held by the capacitor $C_A$ and provided at the output terminal 33 of the operational amplifier 22 during a hold phase in which sample switches S1 and S2 and switches S3 and S4 are opened and hold switch H1 is closed. It is to be appreciated that in certain sample and hold device, the capacitor is directly connected to ground and the sample ground switch is eliminated. In this sample and hold device configuration, the first AC current mirror 24 can be employed without the second AC current mirror 26.

Figure 3:
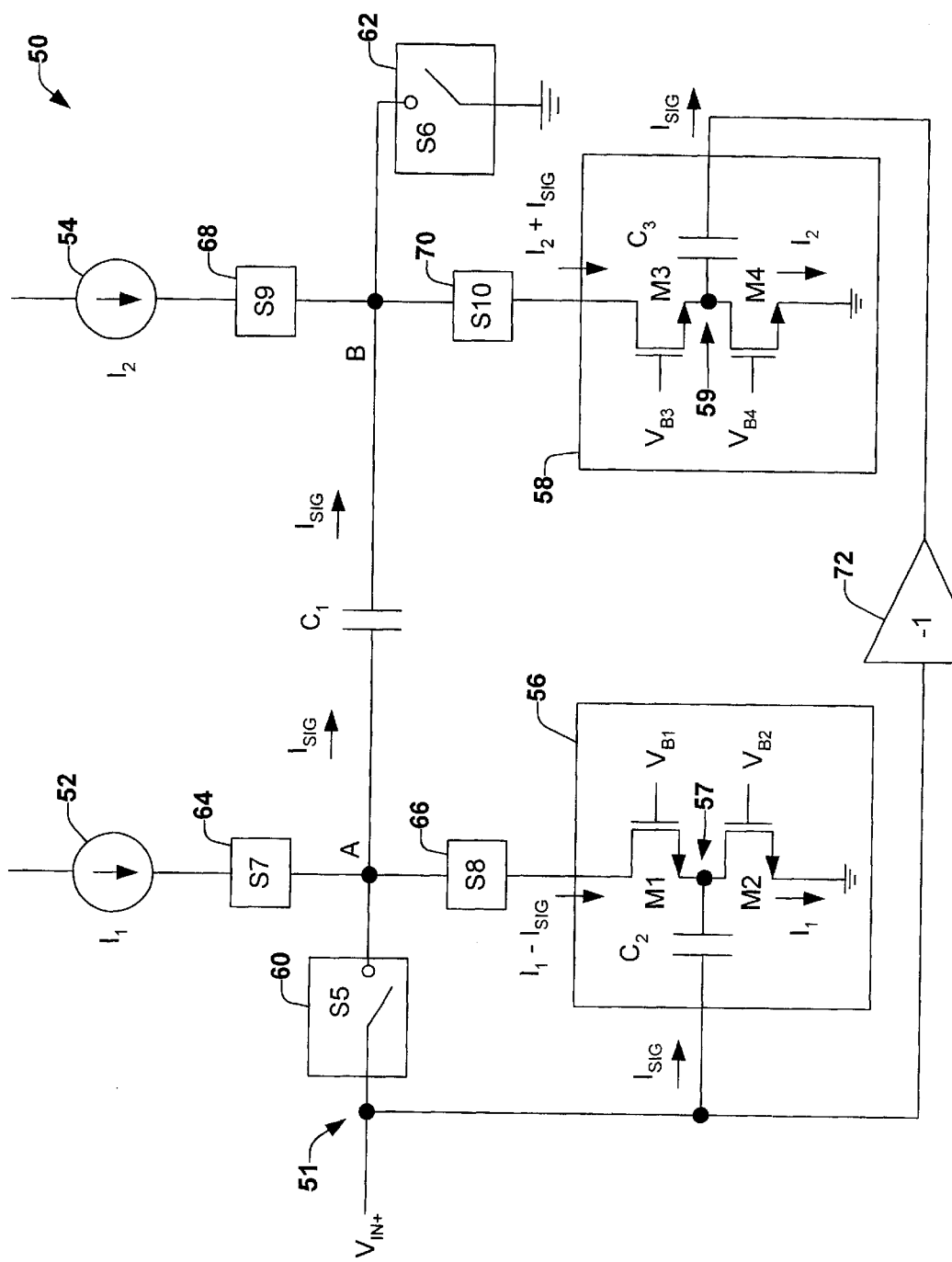
FIG. 3 illustrates a schematic block diagram of a sample portion of a sample and hold device in accordance with an aspect of the present invention.

FIG. 3 illustrates a sample portion 50 of a sample and hold device operative to receive a single ended input signal in accordance with an aspect of the present invention. The sample portion 50 includes a first current source 52 and a first AC current mirror 56 that cooperate to provide current to a sampling capacitor $C_1$, and a second current source 54 and a second AC current mirror 58 that cooperate to remove current from the sampling capacitor $C_1$. The sampling capacitor $C_1$ is coupled between a first node "A" and a second node "B". An input signal sample switch (S5) 60 is coupled between an input signal terminal 51 and the first node "A", and a ground sample switch (S6) 62 is connected between the second node "B" and ground. The sample switches S5 and S6, for example, are MOSFET devices. The input signal sample switch S5 and the ground sample switch S6 are closed during a sample phase in which an input signal voltage $V_{IN+}$ is provided at the first node "A" to charge the capacitor $C_1$ to the voltage amplitude level of the voltage $V_{IN+}$.

The first AC current mirror 56 is comprised of a first n-type MOSFET device M1 and a second MOSFET device M2 arranged as a cascode current source, and a capacitor $C_2$. The gate of the first n-type MOSFET device M1 is coupled to a bias voltage $V_{B1}$ and the gate of the second n-type MOSFET device M2 is coupled to a bias voltage $V_{B2}$, such that the n-type MOSFET devices M1 and M2 are held in a saturation region and carry a current equal to $I_1$. The first n-type MOSFET device M1 has a drain coupled to a switch (S8) 66 and the second n-type MOSFET device M2 has its source coupled to ground. The source of the first n-type MOSFET device M1 and the drain of the second n-type MOSFET device M2 are coupled to a first end of the capacitor $C_2$ through a node 57. The other end of the capacitor $C_2$ is connected to the input signal terminal 51. The input signal $V_{IN+}$ is also provided at an inverted operational amplifier 72, such that the inverted version of the input signal is provided at a capacitor $C_3$.

The second AC current mirror 58 is comprised of a third n-type MOSFET device M3 and a fourth MOSFET device M4 arranged as a cascode current source, and the capacitor $C_3$. The gate of the third n-type MOSFET device M3 is coupled to a bias voltage $V_{B3}$ and the gate of the fourth n-type MOSFET device M4 is coupled to a bias voltage $V_{B4}$, such that the n-type MOSFET devices M3 and M4 are held in a saturated region and carry a current equal to $I_2$. The third n-type MOSFET device M3 has a drain coupled to a switch (S10) 70 and the fourth n-type MOSFET device M4 has its source coupled to ground. The source of the third n-type MOSFET device M3 and the drain of the fourth n-type MOSFET device M4 are coupled to a first end of the capacitor $C_3$ through a node 59. The other end of the capacitor $C_3$ is connected to the output of the operational amplifier 72. The capacitor $C_2$ is substantially equal to the capacitor $C_1$, and the capacitor $C_3$ is substantially equal to the capacitor $C_1$, such that the AC current drawn by the capacitor $C_2$ and $C_3$ are substantially equal to the AC current drawn by the capacitor $C_1$ during a sample phase.

During a sample phase, switches S5–S10 are closed and an input signal $V_{IN+}$ is applied to the sample portion 50 of the sample and hold device. An input signal is applied to the terminal 51, while an inverted version of the input signal is applied to the capacitor $C_3$. The sampling capacitor $C_1$ is connected to the input signal $V_{IN+}$ through the sample switch S5 and to ground through the sample switch S6. With zero input signal ($I_{SIG}$=0), the signal currents in $C_1$ and $C_2$ would both be zero. Thus, all the current $I_1$ supplied by the current source 52 flows through M1 and through M2. Thus, there is no net current flow into node "A". With an input signal $I_{SIG}$ present, the node 57 acts as a virtual ground, the current flowing in $C_1$ is also replicated in $C_2$. This steers away a substantially equal amount of current from the current supplied by M1. Since M2 has a fixed bias voltage at the gate and a fixed source voltage (ground), the current through M2 cannot change and remains at $I_1$. The current through M1 becomes $I_1 - I_{SIG}$ which provides a net current of $I_{SIG}$ into the node "A". This provides the charging current for $C_1$ and mitigates the amount of current flowing through the input sampling switch S5.

In a similar fashion, the capacitor $C_3$ in conjunction with the M3 and M4 helps remove a current $I_{SIG}$ from node B, thus mitigating the current flowing through the ground sampling switch S6. Specifically, with zero input signal ($I_{SIG}$=0), the signal currents in $C_1$ and $C_3$ would both be zero. Thus, all the current $I_2$ supplied by the current source 54 flows through M3 and through M4. With the input signal $I_{SIG}$ present, the node 59 acts as a virtual ground, the current flowing out of $C_1$ is also replicated by $C_3$. This steers a substantially equal amount of current into the current supplied by M3. Since M4 has a fixed bias voltage at the gate and a fixed source voltage (ground), the current through M4 cannot change and remains at $I_2$. The current through M3 becomes $I_2 + I_{SIG}$ which provides a net current of $I_{SIG}$ out of the node "B".

The AC current mirrors 56 and 58 provide low impedance paths for the replicated currents. Therefore, the currents through both sample switches S5 and S6 are redirected such that the high currents required to charge the sampling capacitor $C_1$ at high frequencies do not flow through the sample switches S5 and S6 but flow through alternate paths. Therefore, the voltage drops across the switches S5 and S6 are mitigated since the switches operate in the linear region. The first and second AC current source and mirror combinations provide alternate current paths for the sample portion 50 of the sample and hold device, so that the current through the sample switches S5 and S6 are reduced, while still providing the necessary current to charge the sampling capacitor $C_1$.

Figure 4:
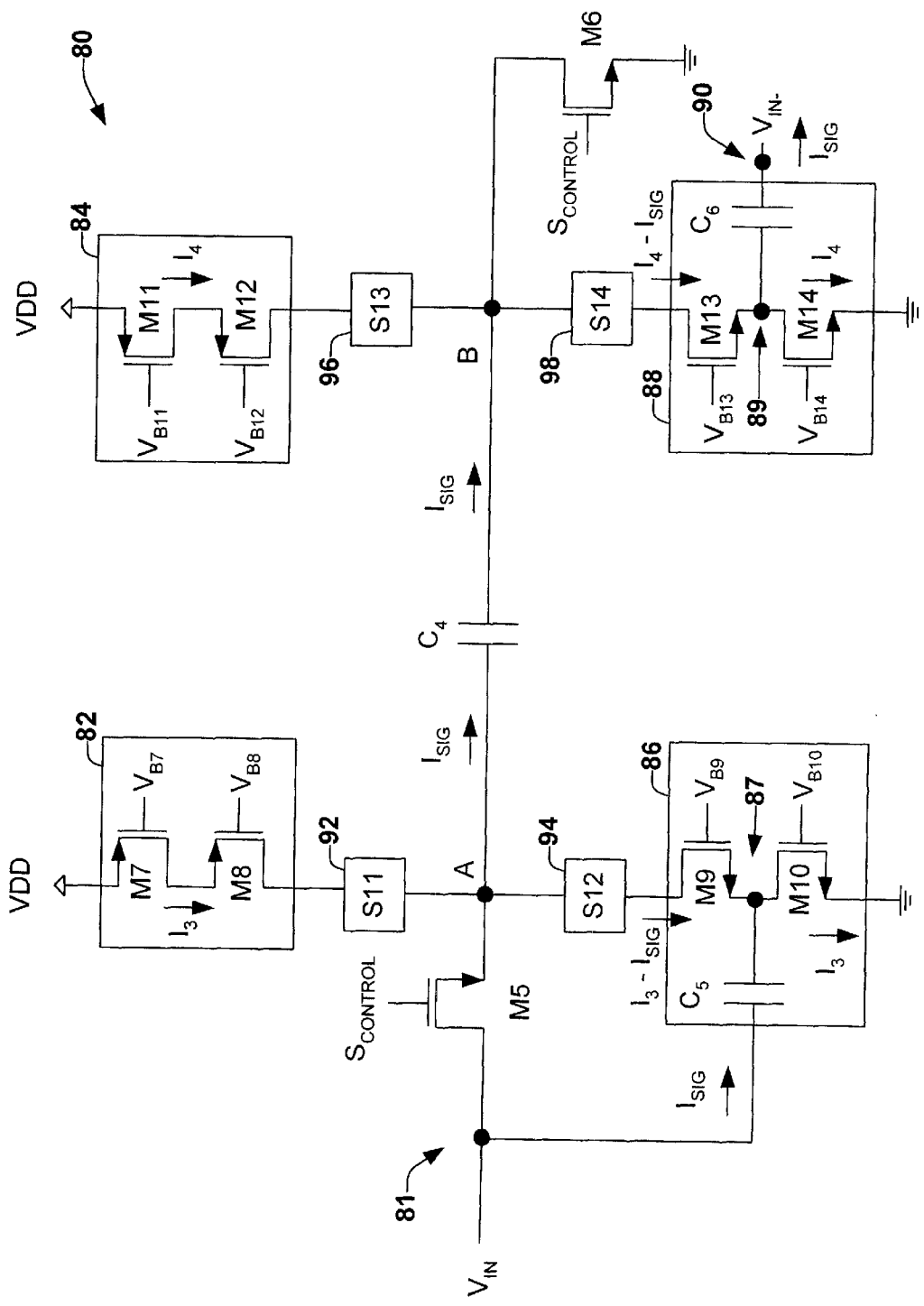
FIG. 4 illustrates a schematic block diagram of a sample circuit of a sample and hold circuit in accordance with an aspect of the present invention.

FIG. 4 illustrates a sample circuit 80 of a sample and hold circuit operative to receive a differential input signal in accordance with an aspect of the present invention. The sample circuit 80 of the sample and hold circuit include a first current source 82 and a first AC current mirror 86 that cooperate to provide current to a sampling capacitor $C_4$, and a second current source 84 and a second AC current mirror 88 that cooperate to remove current from the sampling capacitor $C_4$. The sampling capacitor $C_4$ is coupled between a first node "A" and a second node "B". A first n-type MOSFET switch M5 is coupled between a positive rail input signal terminal 81 and the first node "A", and a second n-type MOSFET switch M6 is connected between the second node "B" and ground. The first n-type MOSFET switch M5 and the second n-type MOSFET switch M6 provide input signal switching and ground connections to the sampling capacitor $C_4$ during a sample phase of the sample and hold circuit. A control signal $S_{CONTROL}$ controls the switching of the first n-type MOSFET switch M5 and the second n-type MOSFET switch M6 between an "ON" and an "OFF" state. It is to be appreciated that the first n-type MOSFET switch M5 and the second n-type MOSFET switch M6 can be replaced with p-type devices in which the control signal switches between opposite digital states than for n-type devices.

The first current source 82 is comprised of a first p-type MOSFET device M7 and a second p-type MOSFET device M8 arranged as a cascode current source, while the second current source is comprised of a third p-type MOSFET device M11 and a fourth p-type MOSFET device M12 arranged as a cascode current source. The gates of the p-type MOSFET device M7, M8, are coupled to bias voltages $V_{B7}$, $V_{B8}$, respectively, to be held in a saturation region and carry a current equal to $I_3$. The gates of the p-type MOSFET device M11, M12, are coupled to bias voltages $V_{B11}$, $V_{B12}$, respectively, to be held in a saturation region and carry a current equal to $I_4$. The first current source 82 and the second current source 84 are coupled to a supply voltage $V_{DD}$ and provide a constant current to the nodes "A" and "B" through a switch (S11) 92 and a switch (S13) 96, respectively. The first AC current mirror 86 is comprised of a first n-type MOSFET device M9 and a second MOSFET device M10 arranged as a cascode current source, and a capacitor $C_5$. The first n-type MOSFET device M9 has a drain coupled to a switch (S12) 94 and the second n-type MOSFET device M10 has its source coupled to ground. The source of the first n-type MOSFET device M9 and the drain of the second n-type MOSFET device M10 are coupled to a first end of the capacitor $C_5$ through a node 87. The other end of the capacitor $C_5$ is connected to the positive rail input signal terminal 81.

The second AC current mirror 88 is comprised of a third n-type MOSFET device M13 and a fourth MOSFET device M14 arranged as a cascode current source, and a capacitor $C_6$. The third n-type MOSFET device M13 has a drain coupled to a switch (S14) 98 and the fourth n-type MOSFET device M14 has its source coupled to ground. The source of the third n-type MOSFET device M13 and the drain of the fourth n-type MOSFET device M14 are coupled to a first end of the capacitor $C_6$ through a node 89. The gates of the n-type MOSFET device M9, M10, M13 and M14 are coupled to bias voltages $V_{B9}$, $V_{B10}$, $V_{B13}$, $V_{B14}$, respectively, to be held in a saturation region. The other end of the capacitor $C_6$ is connected to a negative rail input signal terminal 90. The capacitor $C_5$ is substantially equal to the capacitor $C_4$, and the capacitor $C_6$ is substantially equal to the capacitor $C_4$, such that the AC current drawn by the capacitor $C_5$ and $C_6$ are substantially equal to the AC current drawn by the capacitor $C_4$ during a sample phase.

During a sample phase, sampling transistors M5 and M6 are turned "ON" and switches S11–S14 are closed. A positive rail input signal $V_{IN+}$ is applied to the sampling capacitor $C_4$ at the node "A" through the MOSFET switch M5. With zero input signal ($I_{SIG}=0$), the signal currents in $C_4$ and $C_5$ would both be zero. Thus, all the current $I_3$ supplied by the current source 82 flows through M9 and through M10. Thus, there is no net current flow into node "A". With an input signal $I_{SIG}$ present, the node 87 acts as a virtual ground, the current flowing in $C_4$ is also replicated in $C_5$. This steers away a substantially equal amount of current from the current supplied by M9. Since M10 has a fixed bias voltage at the gate and a fixed source voltage (ground0, the current through M10 cannot change and remains at $I_3$. The current through M9 becomes $I_3-I_{SIG}$ which provides a net current of $I_{SIG}$ into the node "A". This provides the charging current for $C_4$ and mitigates the amount of current flowing through first n-type MOSFET switch M5.

A negative rail input signal $V_{IN-}$ is provided at the capacitor $C_6$. In a similar fashion, the capacitor $C_6$ in conjunction with the M13 and M14 helps remove a current $I_{SIG}$ from node B, thus mitigating the current flowing through second n-type MOSFET switch M6. Specifically, with zero input signal ($I_{SIG}=0$), the signal currents in $C_4$ and $C_6$ would both be zero. Thus, all the current $I_4$ supplied by the current source 84 flows through M13 and through M14. With the input signal $I_{SIG}$ present, the node 89 acts as a virtual ground, the current flowing out of $C_4$ is also replicated by $C_6$. This steers a substantially equal amount of current into the current supplied by M13. Since M14 has a fixed bias voltage at the gate and a fixed source voltage (ground), the current through M14 cannot change and remains at $I_4$. The current through M13 becomes $I_4+I_{SIG}$ which provides a net current of $I_{SIG}$ out of the node "B".

Figure 5:
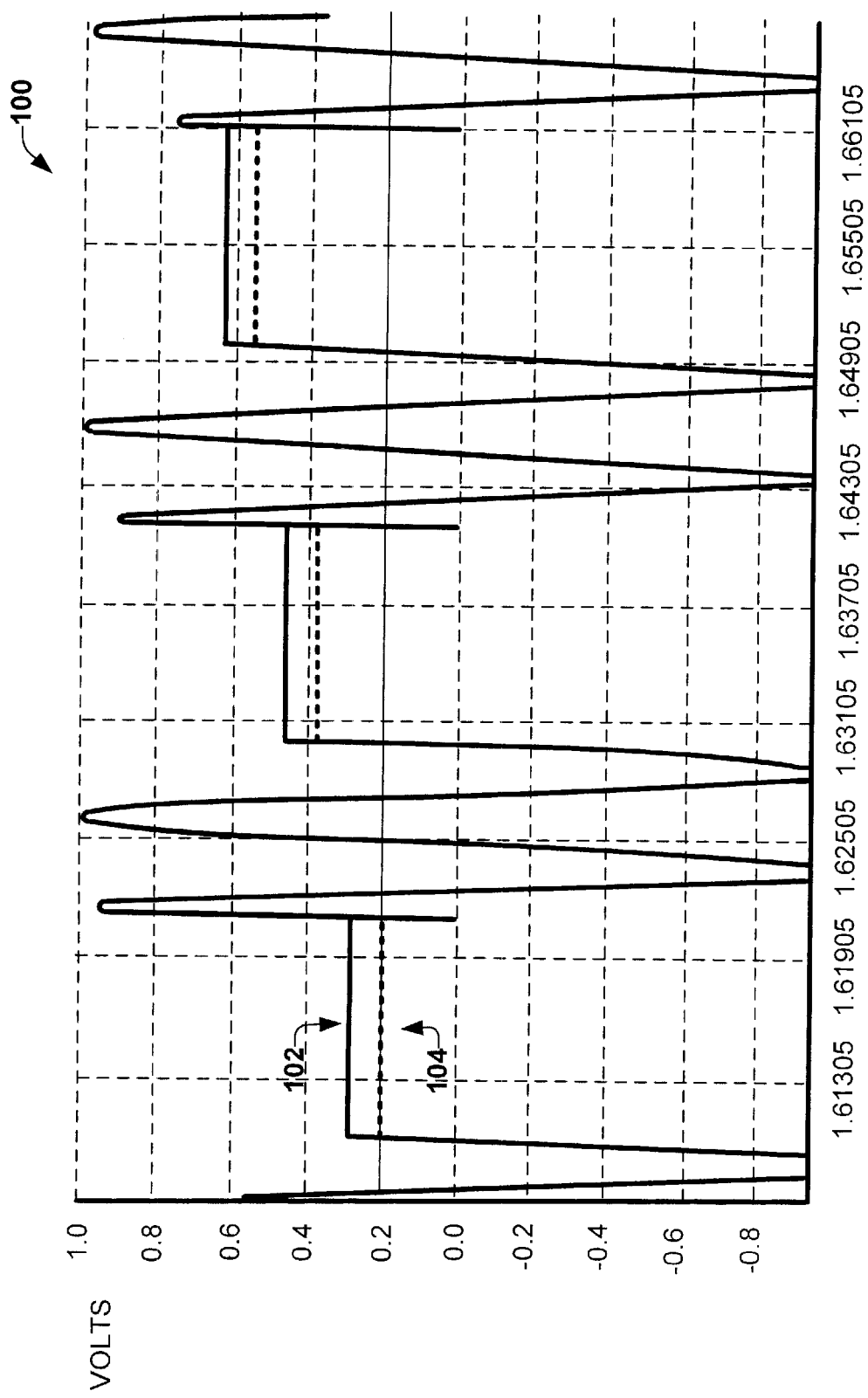
FIG. 5 illustrates a graph of voltage versus time of exemplary simulated output waveforms on a sampling capacitor in accordance with an aspect of the present invention.

FIG. 5 illustrates a graph 100 of voltage (volts) versus time (microseconds) of exemplary simulated output waveforms on a sampling capacitor in response to a 1 $V_{PP}$ input signal at 201 MHZ and a sampling frequency of 50 MHZ. A waveform 102 illustrates an output voltage waveform on a sampling capacitor of a sample and hold device employing a current mirror to steer current into a sampling capacitor along an alternate path with respect to a path through an input switch to the sampling capacitor. A waveform 104 illustrates an output voltage on a sampling capacitor of a conventional sample and hold device. The sampled voltage is about 0.1 volts higher employing an alternate path through an input switch to the sampling capacitor.

Figure 6:
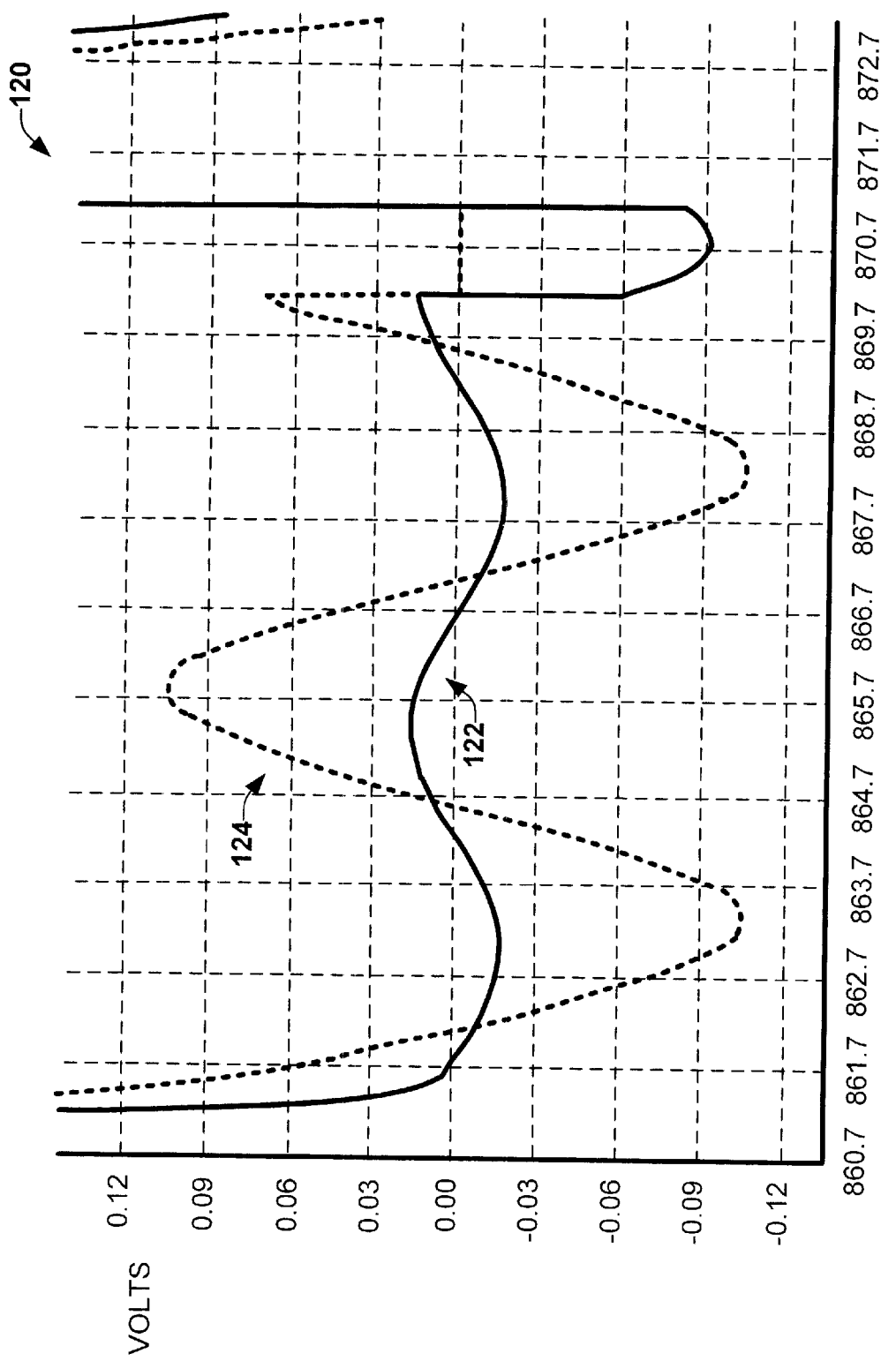
FIG. 6 illustrates a graph of voltage versus time of exemplary simulated waveforms across an input signal sample switch during a sampling phase in accordance with an aspect of the present invention.

FIG. 6 illustrates a graph 120 of voltage (volts) versus time (nanoseconds) of exemplary simulated waveforms across an input signal sample switch during a sampling phase in response to a 1 $V_{PP}$ input signal at 201 MHZ and a sampling frequency of 50 MHZ. A waveform 122 illustrates an output voltage waveform across an input sample switch of a sample and hold device employing a current mirror to steer current into a sampling capacitor along an alternate path with respect to a path through an input switch to the sampling capacitor. A waveform 124 illustrates an output voltage waveform across a sample switch of a conventional sample and hold device. The voltage across the conventional device is substantially higher than the device employing an alternate path through an input switch to the sampling capacitor.

Figure 7:
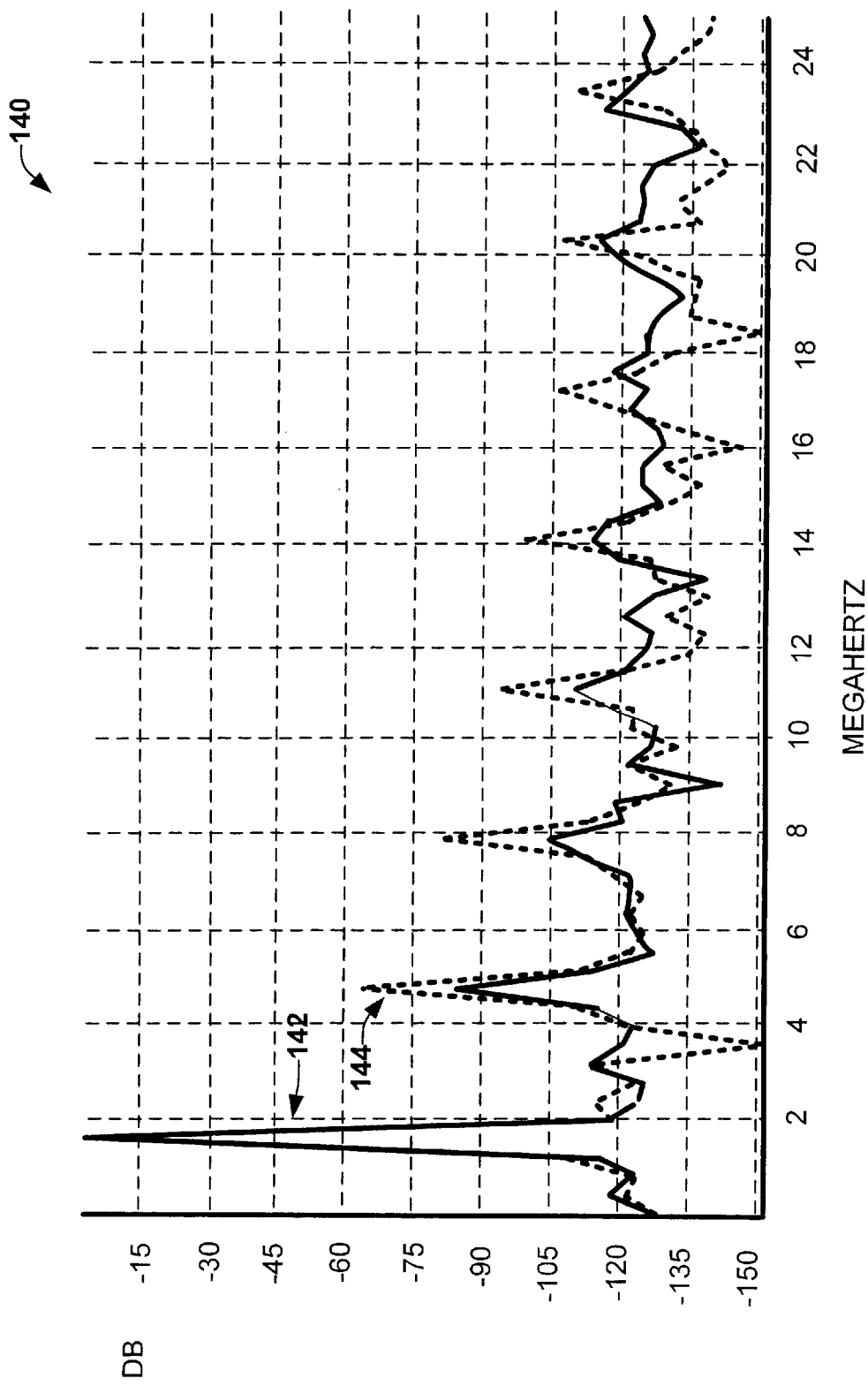
FIG. 7 illustrates a graph of decibels versus frequency of exemplary simulated output spectra on a sampling capacitor in accordance with an aspect of the present invention.

FIG. 7 illustrates a graph 140 of decibels (DB) versus frequency (MegaHertz) of exemplary simulated output spectra on a sampling capacitor in response to a 1 $V_{PP}$ input signal at 201 MHZ and a sampling frequency of 50 MHZ. A waveform 142 illustrates an output spectrum on a sampling capacitor of a sample and hold device employing a current mirror to steer current into a sampling capacitor along an alternate path with respect to a path through an input switch to the sampling capacitor. A waveform 144 illustrates an output spectra on a sampling capacitor of a conventional sample and hold device. The waveform 142 of the sample and hold device employing a current mirror to steer current into a sampling capacitor along an alternate path from a path through an input switch to the sampling capacitor illustrates an improvement in mitigating distortion of more than 20 DB over the conventional sample and hold device.

Figure 8:
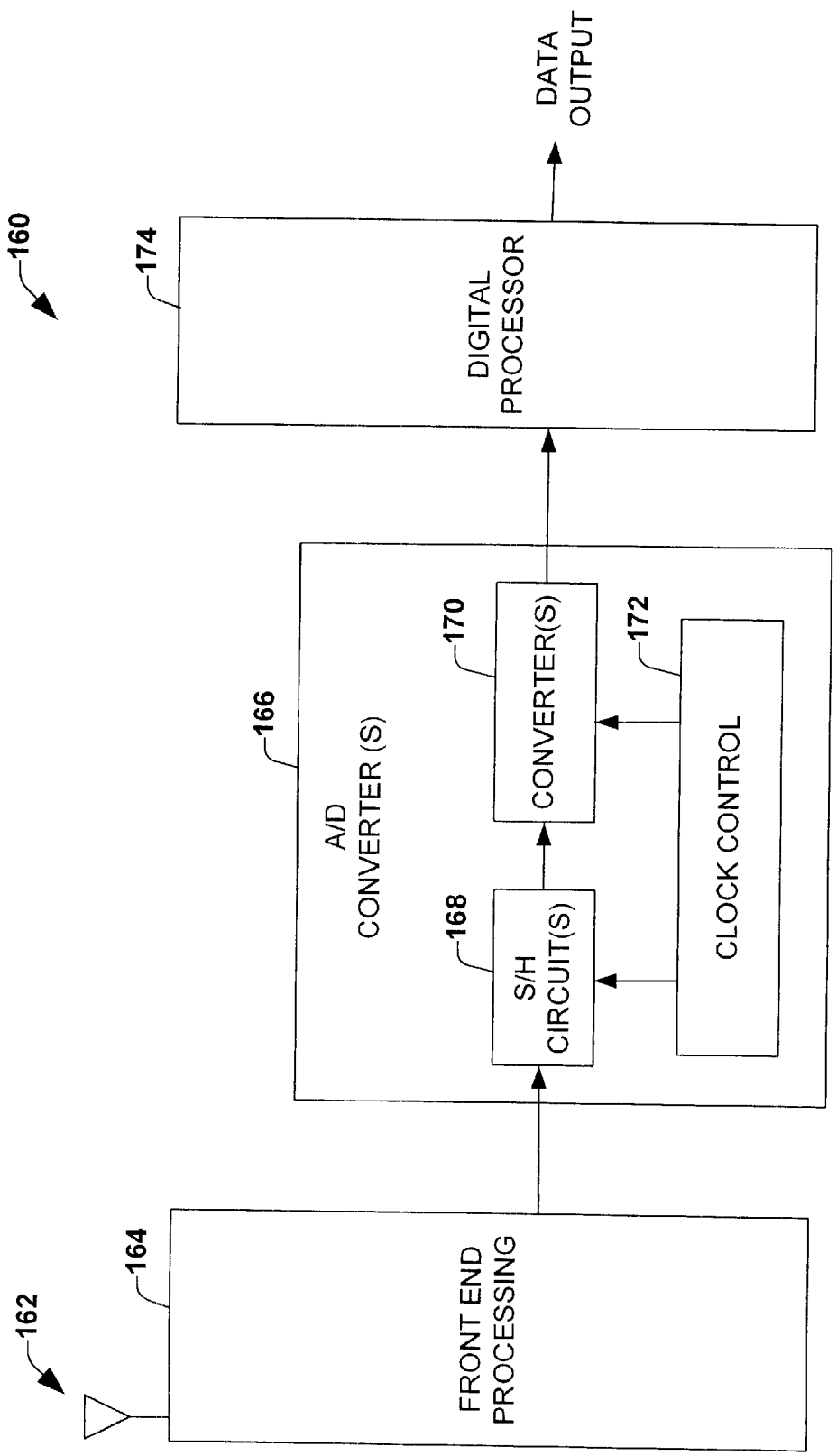
FIG. 8 illustrates a block diagram of a wireless receiver employing a sample and hold device in accordance with an aspect of the present invention.

FIG. 8 illustrates a functional block diagram of a wireless receiver system 160 employing a sample and hold device in accordance with one aspect of the present invention. A transmission signal or burst is received by an antenna 162, which captures the transmission signal and transmits the transmission signal to a front end processing component 164. A transmission signal or burst can carry data, synchronization information, command information, calibration information or a variety of other information associated with the wireless system in which the wireless receiver is a member. The front end processing component 164 amplifies the transmission signal, converts the transmission signal to an intermediate frequency (IF) and filters the data signal to eliminate signals that are outside of the desired frequency band. It is to be appreciated that many variations in receiver front end processing exist. For example, some receiver front end processing includes utilizing multiple IF frequencies and successive frequency conversions. Additionally, some receivers provide direct radio frequency (RF) sampling without IF stages.

The front end processing component 164 feeds one or more analog-to-digital (A/D) converters 166 that sample the data signal and provide a digitized signal output. The one or more A/D converters include one or more sample and hold circuits 168 coupled to one or more converters 170. The sample and hold circuits 168 employ a current mirror configuration as illustrated in FIGS. 2–4 to provide alternate current paths to sample switches provided in the sample and hold circuits 168. A clock control component 172 controls the sample and hold phases of the sample and hold circuits in addition to the timing of the conversion processes executed by the converters 170.

The digitized signal output of the one or more A/D converters 166 is then provided to a digital processor 174. The digital processor 174 provides additional filtering of the digitized signals. The exact implementation of the digital processor 174 can vary depending on the particular receiver architecture being employed to provide the information in the transmission. The information can then be demodulated and/or decoded. The digital processor 174 receives digitized data associated with multiple samples of the input signal at varying amplitude levels. The digital processor can then perform a piecewise approximation to provide a digital representation as data output associated with the received input signal.

Figure 9:
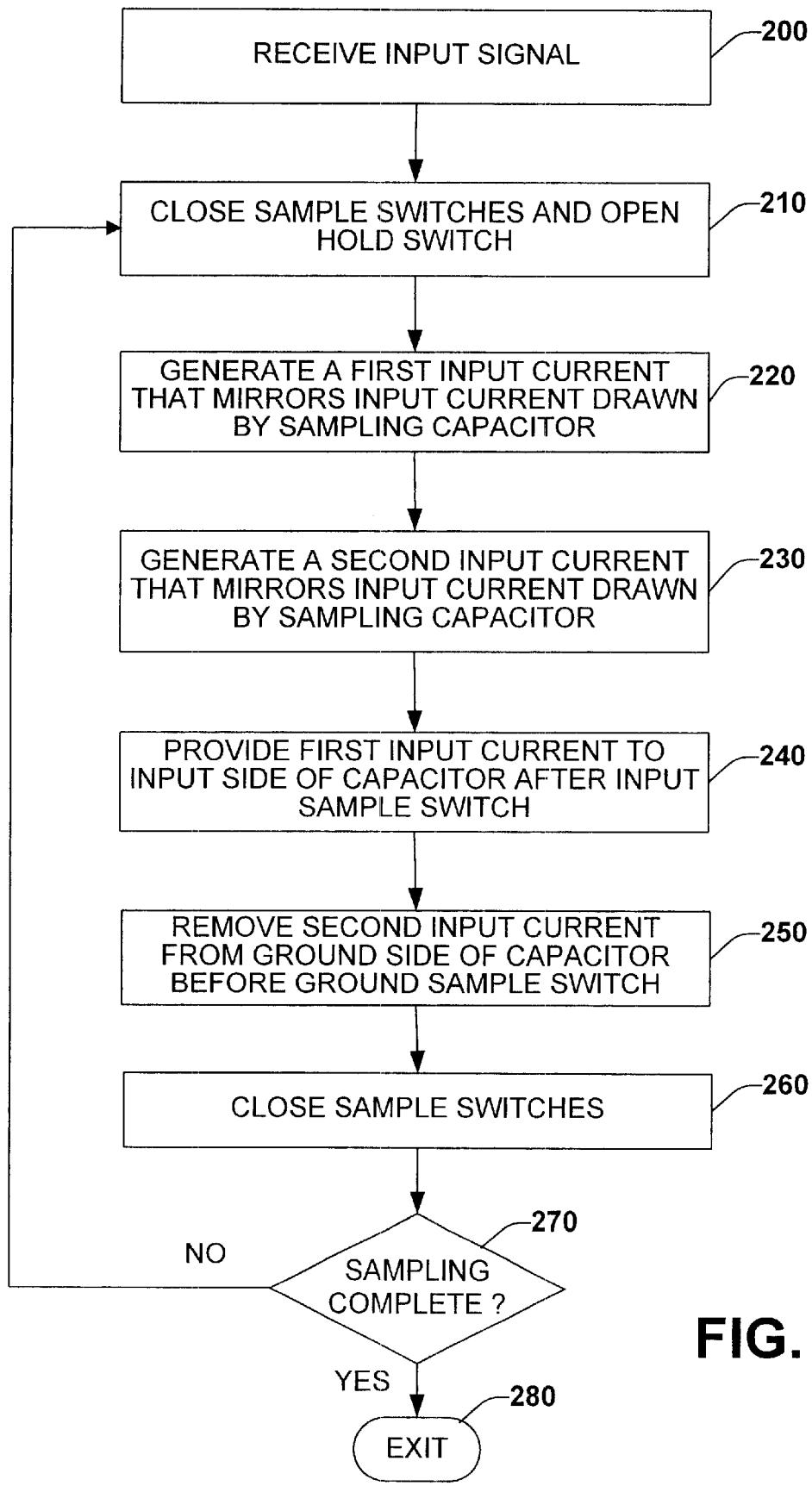
FIG. 9 illustrates a methodology for operating a sample and hold device in accordance with an aspect of the present invention.

In view of the foregoing structural and functional features described above, methodologies in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 9 illustrates one particular methodology for operating a sample and hold device having a sampling capacitor having a first end coupled to an input voltage signal through an input sample switch and a second end to ground through a ground sample switch. The methodology begins at 200 where a continuous time-varying amplitude input signal $V_{IN}$ (e.g., AC sine wave) is applied at an input terminal of the sample and hold device. At 210, the sample switches are opened and the hold switch is closed. At 220, a first input current is replicated along a first alternate path relative to the path of the sampling capacitor. The first input current mirrors the input current drawn by the sampling capacitor. At 230, a second input current is replicated along a second alternate path relative to the path of the sampling capacitor and the first alternate path. The second input current also mirrors the input current drawn by the sampling capacitor. The first and second input currents can be replicated concurrently. The methodology then proceeds to 240.

At 240, the first input current is steered to the input side of the capacitor after the input sample switch. The second input current is then steered out of the ground side of the capacitor before the ground sample switch at 250. The first input current is provided at the input side of the capacitor and the second input current is removed from the ground side of the sampling capacitor concurrently. At 260, the sample switches are opened and the hold switch is closed, so that the input signal charged on the sampling capacitor can be processed. The methodology then proceeds to 270 to determine if the sampling of the input signal has been completed. If the sampling of the input signal has not been completed (NO), the methodology returns to 210 to continue the sampling of the input signal. If the sampling of the input signal has been completed (YES), the methodology exits the routine at 280 and the complete sampling of the signal can then be converted into a digital representation of the input signal.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A sample and hold device comprising:
   a sampling capacitor coupled at a first end to an input terminal through an input sample switch and a second end to a ground, the sampling capacitor operative to receive a voltage input signal at the input terminal during a sample chase and charge to a voltage amplitude level of the input signal that is held by the sampling capacitor during a hold phase: and
   a current mirror that generates a current that is a replicate of a current drawn by the sampling capacitor during the sample phase and steers the replicated current through an alternate path with respect to a path through the input sample switch to the first end of the capacitor to mitigate the current flowing through the input sample switch; and
   wherein the second end of the capacitor is coupled to ground through a ground sample switch and a second current mirror that generates a second current that replicates a current drawn by the sampling capacitor during the sample phase and steers the second replicated current through an alternate path with respect to a path through the ground sample switch to remove current from the second end of the sampling capacitor to mitigate the current flowing through the ground sample switch.

2. The device of claim 1, the voltage input signal being a differential input signal such that the current mirror receives a positive rail voltage input signal and the second current mirror receives a negative rail voltage input signal.

3. The device of claim 1, further comprising an inverted amplifier that provides an inverted version of the voltage input signal to the second current mirror.

4. The device of claim 1, the input sample switch and the ground sample switch being MOSFET devices.

5. The device of claim 1, the second current mirror cooperates with a current source to direct the second replicated current from the second end of the sampling capacitor.

6. The device of claim 1, the second current mirror comprising a capacitor having a capacitive value substantially equivalent to the sampling capacitor, such that the capacitor draws current substantially equivalent to current drawn by the sampling capacitor.

7. A sample and hold device comprising:
a sampling capacitor coupled at a first end to an input terminal through an input sample switch and a second end to a around the sampling capacitor operative to receive a voltage input signal at the input terminal during a sample phase and charge to a voltage amplitude level of the input signal that is held by the sampling capacitor during a hold phase: and
a current mirror that generates a current that is a replicate of a current drawn by the sampling capacitor during the sample phase and steers the replicated current through an alternate path with respect to a path through the input sample switch to the first end of the capacitor to mitigate the current flowing through the input sample switch; and
wherein the current mirror comprises a capacitor having a capacitive value substantially equivalent to the sampling capacitor, such that the capacitor draws current substantially equivalent to current drawn by the sampling capacitor.

8. The device of claim 7, the current mirror further comprising a cascade pair coupled to the capacitor.

9. A sample and hold device comprising:
a sampling capacitor coupled at a first end to an input terminal through an input sample switch and a second end to a ground, the sampling capacitor operative to receive a voltage input signal at the input terminal during a sample phase and charge to a voltage amplitude level of the input signal that is held by the sampling capacitor during a hold phase; and
a current mirror that generates a current that is a replicate of a current drawn by the sampling capacitor during the sample phase and steers the replicated current through an alternate path with respect to a path through the input sample switch to the first end of the capacitor to mitigate the current flowing through the input sample switch; and
wherein the current mirror directs the replicated current into the first end of the sampling capacitor.

10. A sample and hold circuit comprising:
a sampling capacitor coupled at a first end to an input terminal through an input sample switch and a second end coupled to a ground through a ground sample switch, the sampling capacitor operative to receive a voltage input signal at the input terminal during a sample phase and charge to a voltage amplitude level of the input signal that is held by the sampling capacitor during a hold phase;
a first capacitor that draws a first current along a first alternate path with respect to a path through the input sample switch, the first current is a substantial replicate of a current required to charge the sampling capacitor during the sample phase, the first current being directed into the first end of the sampling capacitor to mitigate the current flowing through the input sample switch; and
a second capacitor that draws a second current along a second alternate path with respect to a path through the ground sample switch, the second current is a substantial replicate of a current required to charge the sampling capacitor during the sample phase, the second current being directed out of the second end of the sampling capacitor to mitigate the current flowing through the ground sample switch.

11. The circuit of claim 10, the first capacitor being part of a first current mirror and the second capacitor being part of a second current mirror, the first capacitor receives a positive version of the voltage input signal and the second capacitor receives an inverted version of the voltage input signal, such that the first current mirror steers the first current Into the first end of the sampling capacitor and the second current mirror steers the second current from the second end of the sampling capacitor.

12. The circuit of claim 11, the first current mirror cooperates with a first current source to direct current into the first end of the sampling capacitor and the second current mirror cooperates with a second current source to direct current from the second end of the sampling capacitor.

13. The circuit of claim 10, the voltage input signal being a differential signal such that the positive rail of the differential signal is provided to the first capacitor and the negative rail of the differential signal is provided to the second capacitor.

14. The circuit of claim 10, further comprising an inverting amplifier that receives the positive version of the voltage input signal and provides the negative version of the voltage input signal.

15. The circuit of claim 10, the input sample switch and the ground sample switch being MOSFET devices.

16. A method for operating a sample and hold device having an input sampling switch that couples a first end of a sampling capacitor to an input voltage signal and a hold switch that couples the sampling capacitor to an output terminal, the method comprising:
receiving an input voltage signal;
opening the hold switch and closing the input sample switch to couple the sampling capacitor to the input voltage signal;
generating a first current that replicates a current required to charge the sampling capacitor to a voltage amplitude level of the input voltage signal;
directing the first current through an alternate path with respect to a path through the input sample switch into the first end of the sampling capacitor to mitigate current through the input sample switch; and
closing the hold switch and opening the input sample switch to couple the sampling capacitor to the output terminal.

17. The method of claim 16, further comprising generating a second current that replicates a current required to charge the sampling capacitor to a voltage amplitude level of the input voltage signal, and directing the second current from a second end of the sampling capacitor to mitigate current through a ground sample switch that couples a second end of the sampling capacitor to ground.

18. The method of claim 17, further comprising employing an inverted version of the input voltage signal in generating the second current.

19. The method of claim 17, the first current being generated by a current mirror having a first capacitor and the second current being generated by a current mirror having a second capacitor, the first capacitor and the second capacitor having capacitive values substantially equivalent to the sampling capacitor.

20. A sample and hold device having an input sampling switch that couples a first end of a sampling capacitor to an input voltage signal and a ground sampling switch that couples a second end of the sampling capacitor to ground, the device comprising:
means for providing current that replicates a current required to charge the sampling capacitor to a voltage amplitude level of the input voltage signal to the first end of the sampling capacitor through an alternate path with respect to a path through the input sampling switch; and means for discharging current that replicates a current required to charge the sampling capacitor to a voltage amplitude level of the input voltage signal from the second end of the capacitor through an alternate path with respect to a path through the ground sampling switch.

21. The device of claim 20, the means for providing current comprising means for generating a first current and means for steering the first current to the first end of the capacitor through an alternate path with respect to a path through the input sampling switch.

22. The device of claim 20, the means for discharging current comprising means for generating a second current and means for steering the second current from the second end of the capacitor through an alternate path with respect to a path through the ground sampling switch.

23. The device of claim 20, the input sample switch and the ground sample switch being MOSFET devices and the input voltage signal being a continuous time-varying amplitude input signal.

24. The device of claim 23, the continuous time-varying amplitude input signal being a differential input signal, the means for providing current employing a positive rail of the input voltage signal to replicate the current and the means for discharging employing a negative rail of the input voltage signal to replicate the current.

* * * * *